US010042465B2

(12) United States Patent
Kang et al.

(10) Patent No.: US 10,042,465 B2
(45) Date of Patent: Aug. 7, 2018

(54) DISPLAY DEVICE HAVING UNEXPOSED TOUCH WIRES

(71) Applicant: Samsung Display Co., Ltd., Yongin-si (KR)

(72) Inventors: Jae-Wook Kang, Hwaseong-si (KR); Jung Ha Son, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 80 days.

(21) Appl. No.: 15/183,125

(22) Filed: Jun. 15, 2016

(65) Prior Publication Data

US 2017/0090651 A1    Mar. 30, 2017

(30) Foreign Application Priority Data

Sep. 30, 2015  (KR) .................. 10-2015-0138157

(51) Int. Cl.
*G06F 3/041* (2006.01)
*G06F 3/044* (2006.01)
*H01L 27/12* (2006.01)

(52) U.S. Cl.
CPC ............ *G06F 3/0416* (2013.01); *G06F 3/044* (2013.01); *G06F 3/0412* (2013.01); *H01L 27/124* (2013.01); *G06F 2203/04102* (2013.01)

(58) Field of Classification Search
CPC ...... G06F 3/041; G06F 3/0412; G06F 3/0416; G06F 3/044; G06F 2203/04102; G06F 2203/04103; G06F 2203/04111; G06F 2203/04113; G09G 3/3225–3/3291; G09G 3/3648–3/3696; G09G 2300/0421; G09G 2300/0426; G09G 2380/02; H01L 27/12; H01L 27/1214; H01L 27/124–27/1248; H01L 27/1259–27/1296; H01R 9/07–9/0764; H01R 12/59–12/62; H01R 12/77–12/79; H01R 35/00–35/04
See application file for complete search history.

(56) References Cited

U.S. PATENT DOCUMENTS

| 9,299,750 | B2 | 3/2016 | Lim et al. | |
| 2010/0110041 | A1* | 5/2010 | Jang | G06F 3/0412 345/174 |
| 2012/0105344 | A1* | 5/2012 | Ko | G06F 3/044 345/173 |
| 2013/0314124 | A1* | 11/2013 | Ikeda | H01L 27/124 326/41 |

(Continued)

FOREIGN PATENT DOCUMENTS

| KR | 10-1359658 | 1/2014 |
| KR | 10-2014-0079994 | 6/2014 |
| KR | 10-2014-0084961 | 7/2014 |

*Primary Examiner* — Nathan Danielsen
(74) *Attorney, Agent, or Firm* — H. C. Park & Associates, PLC

(57) ABSTRACT

A display device includes a display panel including a display unit configured to display an image, a pad portion disposed in a periphery of the display unit, the pad portion configured to receive a driving signal for driving the display unit, and a touch sensor disposed on the display panel. The touch sensor includes sensing electrodes disposed on the display panel, and touch wires electrically connected to the pad portion and disposed on the display panel, the touch wires being respectively connected to the sensing electrodes to transmit a touch signal.

15 Claims, 7 Drawing Sheets

(56) References Cited

U.S. PATENT DOCUMENTS

2014/0160377 A1* 6/2014 Yamagishi .............. G06F 3/044
　　　　　　　　　　　　　　　　　　　　349/12
2014/0240616 A1* 8/2014 Huang .................... G06F 3/044
　　　　　　　　　　　　　　　　　　　　349/12
2015/0022483 A1　 1/2015 Lai et al.
2016/0293631 A1* 10/2016 Sun ........................ G06F 3/041

* cited by examiner

DISPLAY DEVICE HAVING UNEXPOSED TOUCH WIRES

CROSS-REFERENCE TO RELATED APPLICATION

This application claims priority from and the benefit of Korean Patent Application No. 10-2015-0138157 filed on Sep. 30, 2015, which is hereby incorporated by reference for all purposes as if fully set forth herein.

BACKGROUND

Field

Exemplary embodiments relate to a display device, and, more particularly, to a display device integrated with a touch sensor.

Discussion of the Background

A touch sensor, which allows a user to input information by contacting a screen using a finger, a pen, etc., may be applied as an input device of a display device. Among various sensing types of the touch sensor, a capacitive type utilizes two electrodes spaced apart from each other, to sense a position where the capacitance has changed from a contact.

To implement a flexible display device, a display device may be formed to have a thin thickness. To this end, a touch sensor may be integrated into a display device. An on-cell type touch sensor may not include a substrate for the touch sensor, and, thus a sensing electrode may be directly formed on any one component of the display device.

A touch driving unit controls an operation of the touch sensor. The touch driving unit may transmit a sensing input signal to the touch sensor, or may receive a sensing output signal to process it. The touch driving unit may process the sensing output signal to generate touch information, such as the occurrence of a touch, a touch position, and the like. The touch driving unit may be disposed on a separate printed circuit board (PCB), and may be connected to a touch pad portion. However, in the touch pad portion, a portion of touch wires connected to the touch electrodes may be exposed. When the touch wires are exposed to the outside, corrosion may occur on the touch wires from moisture and the like.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide a display device, in which touch wires may be prevented from being exposed in a touch pad portion.

Exemplary embodiments of the present invention also provide a display device that may reduce the number of printed circuit boards (PCBs) and integrated circuit (IC) chips used in the display device.

Additional aspects will be set forth in the detailed description which follows, and, in part, will be apparent from the disclosure, or may be learned by practice of the inventive concept According to an exemplary embodiment of the present invention, a display device includes a display panel including a display unit configured to display an image, a pad portion disposed in a periphery of the display unit, the pad portion configured to receive a driving signal for driving the display unit, and a touch sensor disposed on the display panel. The touch sensor includes sensing electrodes disposed on the display panel, and touch wires electrically connected to the pad portion and disposed on the display panel, the touch wires being respectively connected to the sensing electrodes to transmit a touch signal.

According to an exemplary embodiment of the present invention, a display device includes a pixel driving unit configured to transmit a data signal to a pixel via a first line, the first line connected to a first electrode of a pad portion, and a touch driving unit configured to transmit a touch signal to a touch sensor via a second line, the second line connected to a second electrode of the pad portion, in which the pixel driving unit and the touch driving unit are disposed on a single printed circuit board (PCB), the single PCB being connected to the pad portion.

According to exemplary embodiments of the present invention, the touch pad portion for the touch sensor of a display device may be removed, to prevent the touch wires and the like from being exposed and damaged by moisture and the like. In addition, since the touch driving unit and the pixel driving unit are mounted on one PCB in at least one IC chip, the number of PCBs and IC chips used may be reduced.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
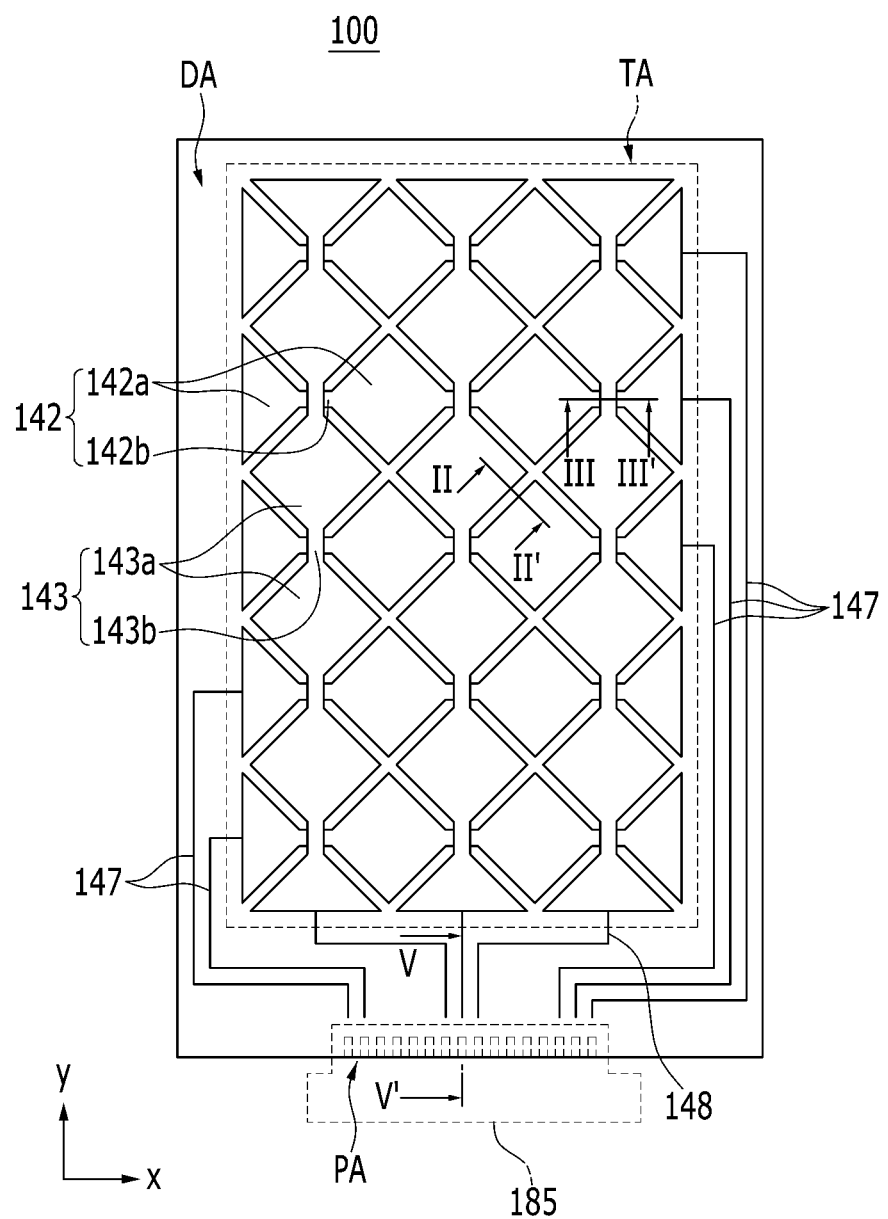
FIG. 1 is a schematic top plan view of a display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
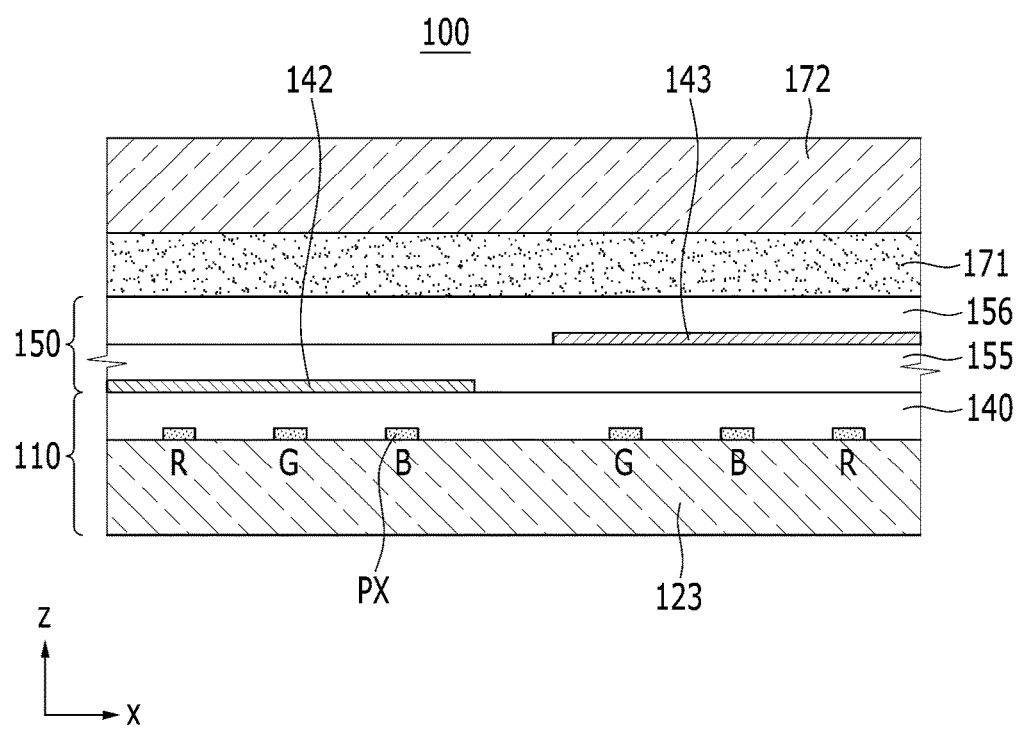
FIG. 2 is a schematic cross-sectional view of the display device taken along line II-II' of FIG. 1.
Figure 3:
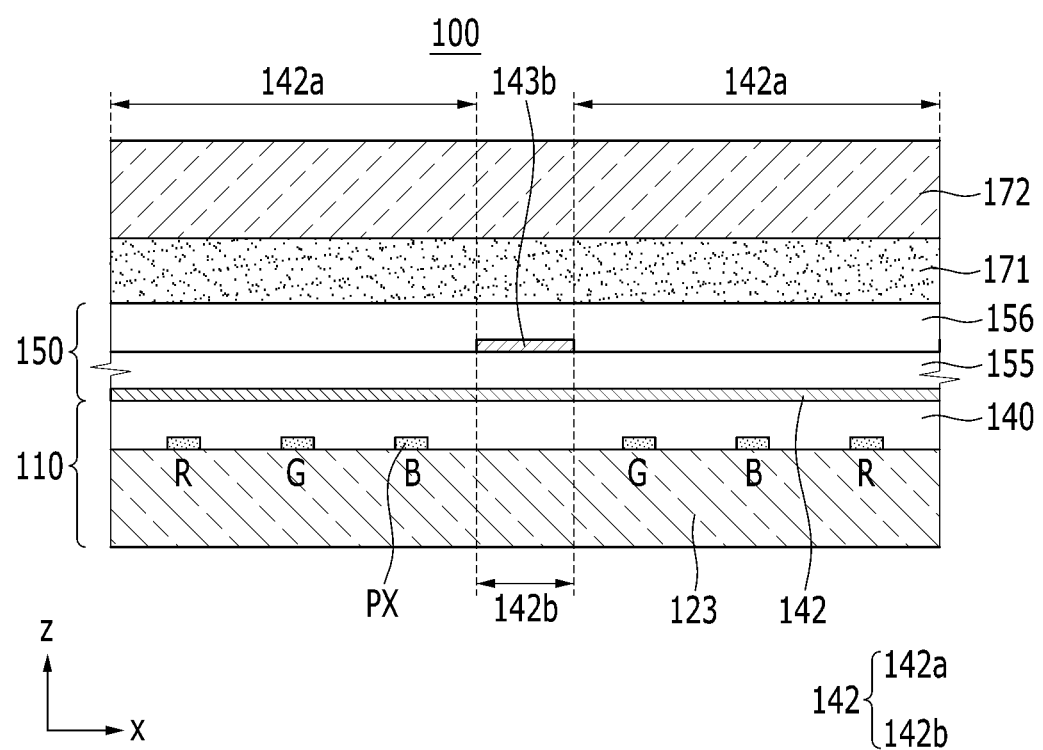
FIG. 3 is a schematic cross-sectional view of the display device taken along line III-III' of FIG. 1.
Figure 4:
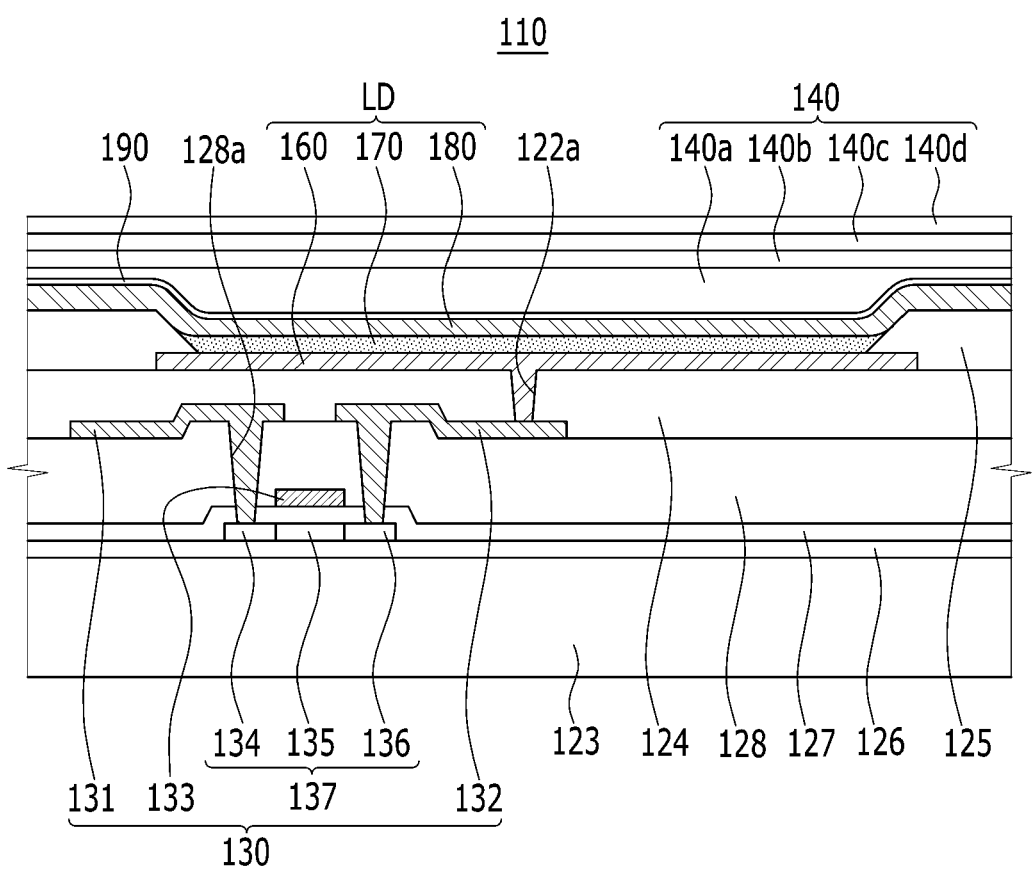
FIG. 4 is an enlarged cross-sectional view of a display panel of a display device according to an exemplary embodiment of the present invention.
Figure 5:
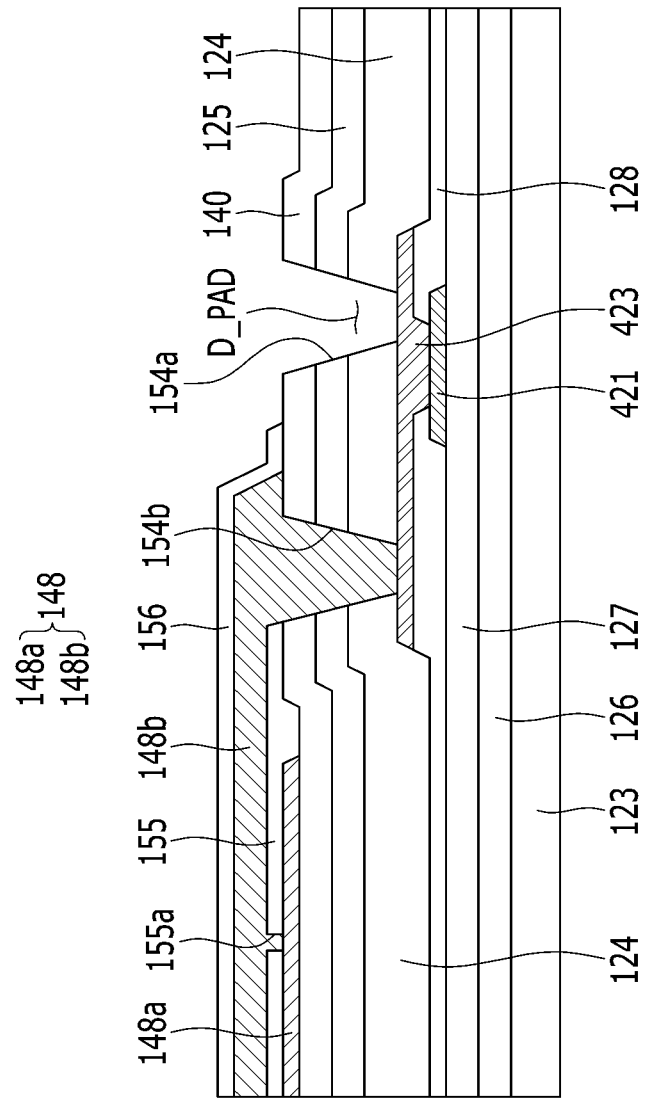
FIG. 5 is a cross-sectional view of a pad portion of the display device taken along line V-V' of FIG. 1 according to an exemplary embodiment of the present invention.

FIG. 1 is a schematic top plan view of a display device according to an exemplary embodiment of the present invention. FIG. 2 is a schematic cross-sectional view of the display device taken along line II-II' of FIG. 1. FIG. 3 is a schematic cross-sectional view of the display device taken along line III-III' of FIG. 1. FIG. 4 is an enlarged cross-sectional view of a display panel of the display device. FIG. 5 is a cross-sectional view of a pad portion of the display device taken along line V-V' of FIG. 1.

Referring to FIGS. 1 to 3, the display device 100 according to the present exemplary embodiment includes a display panel 110 for displaying an image, and a touch sensor 150 formed on the display panel 110. The display device 100 may further include a transparent adhesive layer 171 and a cover window 172 formed on the touch sensor 150. The cover window 172 may protect the touch sensor 150 and the display panel 110 from external impact, moisture, and the like.

Referring to FIGS. 1 and 2, the touch sensor 150 includes sensing electrodes 142 and 143 formed on the display panel 110, and touch wires 147 and 148 connected to the sensing electrodes 142 and 143. The sensing electrodes 142 and 143 are substantially disposed in a touch sensing area TA. The touch wires 147 and 148 may be disposed in the touch sensing area TA or a non-touch sensing area DA.

The sensing electrodes 142 and 143 include first sensing electrodes 142 that are formed parallel to a first direction (x-axis direction), and second sensing electrodes 143 that are formed in a second direction (y-axis direction) crossing the first direction (x-axis direction). The touch wires 147 and 148 include first touch wires 147 that are connected to the first sensing electrodes 142, and second touch wires 148 that are connected to the second sensing electrodes 143. The first and second touch wires 147 and 148 may or may not include portions that are disposed on the same layer as the first and second sensing electrodes 142 and 143.

The first and second sensing electrodes 142 and 143 may have a predetermined transmittance or higher, to transmit light from the display panel disposed therebelow. The first and second sensing electrodes 142 and 143 may include at least one of a metal nanowire, a conductive polymer, such as PEDOT, a metal mesh, a carbon nanotube (CNT), a transparent conductive material, such as indium tin oxide (ITO) and indium zinc oxide (IZO), a thin metal layer, etc.

The first and second touch wires 147 and 148 may include a transparent conductive material included in the first and second sensing electrodes 142 and 143, and/or a low resistance material, such as molybdenum (Mo), silver (Ag), titanium (Ti), copper (Cu), aluminum (Al), molybdenum/ aluminum/molybdenum (Mo/Al/Mo), etc.

The first and second sensing electrodes 142 and 143 form a touch sensor that may sense a contact by using various methods. The touch sensor may be one of various types of touch sensors, such as a resistive type, a capacitive type, an electro-magnetic (EM) type, and an optical type. In the present exemplary embodiment, the touch sensor will be described as a capacitive type, in order to avoid obscuring exemplary embodiments described herein.

In the capacitive type of touch sensor, one of the first and second sensing electrodes 142 and 143 may receive a sensing input signal from the touch driving unit, and may generate and output a sensing output signal to the touch driving unit, which may vary according to a contact of an external object.

When the first and second sensing electrodes 142 and 143 form a self-sensing capacitor along with the external object, the first and second sensing electrodes 142 and 143 may be charged with a predetermined amount of charges in response to receiving the sensing input signal. The first and second sensing electrodes 142 and 143 may sense a contact of an external object, such as a finger and the like, and may output a sensing output signal different than the received sensing input signal, as the amount of charges charged in the self-sensing capacitor may be varied from the contact. In this manner, contact information, such as an occurrence of a contact, a contact position, and the like may be identified by a change in the sensing output signal.

When the first and second sensing electrodes 142 and 143 adjacent to each other form a mutual-sensing capacitor, one of the first and second sensing electrodes 142 and 143 receives the sensing input signal from the touch driving unit, such that the mutual sensing capacitor is charged with a predetermined amount of charges. Subsequently, when a contact occurs from an external object, such as a finger and the like, the amount of charges charged in the mutual sensing capacitor varies, and the varied amount of charges may be outputted as the sensing output signal via the other one of the first and second sensing electrodes 142 and 143. As such, the contact information, such as an occurrence of a contact, a contact position, and the like may be identified by a change in the sensing output signal. In the present exemplary embodiment, the touch sensor will be described with reference to the mutual sensing capacitor, in order to avoid obscuring exemplary embodiments described herein.

Referring to FIG. 1, the first and second sensing electrodes 142 and 143 may be alternately disposed in the touch sensing area TA, such that the first and second sensing electrodes 142 and 143 do not overlap each other. The first sensing electrodes 142 may be respectively arranged along column and row directions, and the second sensing electrodes 143 may be respectively arranged along column and row directions.

The first and second sensing electrodes 142 and 143 may respectively have a quadrangular shape. It is noted that, however, the first and second sensing electrodes 142 and 143 may alternatively have various shapes, such as a protruding portion, to improve sensitivity of the touch sensor. The first and second passivation layers 155 and 156 may include an inorganic material, such as silicon nitride ($SiN_x$), silicon oxide ($SiO_x$), silicon oxynitride ($SiO_xN_y$), etc., or an organic material, such as a polyacrylate resin, a polyimide resin, etc.

The first sensing electrodes 142 arranged in the same row or column may be connected to or separated from each other inside or outside the touch sensing area TA. In addition, at least a portion of the second sensing electrodes 143 arranged in the same column or row may be connected to or separated from each other inside or outside the touch sensing area TA. For example, as shown in FIG. 1, when the first sensing electrodes 142 arranged in the same row, i.e., in the first direction (x-axis direction), are connected to each other inside the touch sensing area TA, the second sensing electrodes 143 arranged in the same column, i.e., in the second direction (y-axis direction), may be connected to each other inside the touch sensing area TA. As used herein, the second direction (y-axis direction) is perpendicular to the first direction (x-axis direction), and represents the same direction as the column direction.

More specifically, the first sensing electrode 142 disposed in each row may include first sensing cells 142a having a substantially rhombus shape, and first connecting portions 142b interconnecting the first sensing cells 142a along the first direction (x-axis direction). The second sensing electrode 143 may include second sensing cells 143a having a substantially rhombus shape, and second connecting portions 143b for interconnecting the second sensing cell 143a along the second direction (y-axis).

In this case, the first and second sensing electrodes 142 and 143 may be formed on different layers from each other. For example, the first sensing electrode 142 may be formed directly on a thin film encapsulation layer 140 to be described below, and may be covered by a first passivation layer 155. The second sensing electrode 143 may be formed on the first passivation layer 155, and may be covered by a second passivation layer 156. In a planar view, the first and second sensing cells 142a and 143a neighbor each other, and the first and second connecting portions 142b and 143b overlap each other. However, the first and second sensing cells 142a and 143a, and the first and second connecting portions 142b and 143b, are respectively insulated from each other by the first passivation layer 155.

According to the present exemplary embodiment, the first and second sensing electrodes 142 and 143 are disposed on different layers from each other. It is noted that, however, the first and second sensing electrodes 142 and 143 may be disposed on the same layer. Alternatively, the first and second sensing electrodes 142 and 143 may be respectively formed as double metal layers.

Referring back to FIG. 1, the first sensing electrodes 142 of each row connected to each other may be connected to the touch driving unit (not shown) via the first touch wires 147, and the second sensing electrodes 143 of each column connected to each other may be connected to the touch driving unit via the second touch wires 148. The first and second touch wires 147 and 148 may be disposed in the non-touch sensing area DA. Alternatively, the first and second touch wires 147 and 148 may be disposed in the touch sensing area TA.

Referring to FIGS. 2 and 3, the display panel 110 includes pixels PX spaced apart from each other. The display panel 110 displays an image by combining light emitted from the pixels PX. Hereinafter, a detailed structure of the pixels PX will be described with reference to FIG. 4.

Referring to FIG. 4, the display panel 110 may display an image. The display panel 110 will be described with reference to an organic light-emitting diode (OLED) display including an organic light emitting element. It is noted that, however, the display panel 110 may be a liquid crystal display (LCD), a plasma display device (PDP), a field effect display (FED), an electrophoretic display, or the like.

A substrate 123 may include an inorganic material, such as glass, a metal material, an organic material, such as a resin, etc. The substrate 123 may transmit or block light, and may be flexible.

A substrate buffer layer 126 is formed on the substrate 123. The substrate buffer layer 126 may prevent penetration of impurity elements and planarize a surface of the substrate 123. The substrate buffer layer 126 may include various materials. For example, any one of a silicon nitride ($SiN_x$) layer, a silicon oxide ($SiO_x$) layer, and a silicon oxynitride ($SiO_xN_y$) layer may be used as the substrate buffer layer 126. However, depending on kinds of the substrate 123 and processing conditions thereof, the substrate buffer layer 126 may be omitted.

A driving semiconductor layer 137 is formed on the substrate buffer layer 126. The driving semiconductor layer 137 includes a polysilicon. The driving semiconductor layer 137 includes a channel region 135 not doped with impurities, and source and drain regions 134 doped with impurities formed at both sides of the channel region 135. A doped ion material is a P-type impurity, such as boron (B), and diborane ($B_2H_6$) is generally used. It is noted that, however, the types of impurities may vary depending on types of thin-film transistors.

A gate insulating layer 127 including silicon nitride ($SiN_x$) or silicon oxide ($SiO_x$) is formed on the driving semiconductor layer 137. A gate line including a driving gate electrode 133 is formed on the gate insulating layer 127. The driving gate electrode 133 may be formed to overlap at least a portion of the driving semiconductor layer 137, more particularly, the channel region 135 thereof.

An interlayer insulating layer 128 covering the driving gate electrode 133 is formed on the gate insulating layer 127. A contact hole 128a exposing the source and drain regions 134 and 136 of the driving semiconductor layer 137 is formed in the gate insulating layer 127 and in the interlayer insulating layer 128. The interlayer insulating layer 128 may include a ceramic-based material, such as silicon nitride ($SiN_x$) or silicon oxide ($SiO_x$).

A data line including a driving source electrode 131 and a driving drain electrode 132 is formed on the interlayer insulating layer 128. The driving source electrode 131 and the driving drain electrode 132 are respectively connected to the source and drain regions 134 and 136 of the driving semiconductor layer 137 via the contact hole 128a, which is disposed on the interlayer insulating layer 128 and the gate insulating layer 127. As such, a driving thin-film transistor 130 is formed by the driving semiconductor layer 137, the driving gate electrode 133, the driving source electrode 131, and the driving drain electrode 132. It is noted that, however, the configuration of the driving thin-film transistor 130 may be varied.

A planarization layer 124 covering the data line is formed on the interlayer insulating layer 128. The planarization layer 124 may reduce or prevent a step, and, thus planarize a surface to improve luminous efficiency of the organic light emitting element LD that will be formed thereon. The planarization layer 124 includes a via hole 122a that exposes a portion of the drain electrode 132.

The planarization layer 124 may be include at least one of a polyacrylate resin, an epoxy resin, a phenolic resin, a polyamide resin, a polyimide resin, an unsaturated polyester resin, a polyphenylene resin, a polyphenylene sulfide resin, and benzocyclobutene (BCB). Either one of the planarization layer 124 and the interlayer insulating layer 128 may be omitted. In this case, a first electrode of the organic light emitting element LD, i.e., a pixel electrode 160, is formed on the planarization layer 124. That is, the OLED display includes pixel electrodes 160 that are respectively disposed in pixels PX. In this case, the pixel electrodes 160 are disposed to be separated from each other. The pixel electrode 160 is connected to the drain electrode 132 via the via hole 122a of the electrode of the planarization layer 124.

A pixel defining layer 125 including an opening, which exposes the pixel electrode 160, is formed on the planarization layer 124. That is, the pixel defining layer 125 includes openings that are formed in each of the pixels. An organic emission layer 170 may be formed in each opening that is formed by the pixel defining layer 125. Accordingly, a pixel area, in which each organic emission layer 170 is formed by the pixel defining layer 125, may be defined. In this case, the pixel electrode 160 is disposed to correspond to the openings of the pixel defining layer 125. Alternatively, the pixel electrode 160 may be disposed below the pixel defining layer 125, such that a portion of the pixel electrode 160 overlaps the pixel defining layer 125. The pixel defining layer 125 may include a polyacrylate resin, a polyimide resin, or a silica-based inorganic material.

The organic emission layer 170 is formed on the pixel electrode 160. A second electrode, i.e., a common electrode 180, may be formed on the organic emission layer 170. As such, the organic light emitting element LD including the pixel electrode 160, the organic emission layer 170, and the common electrode 180 is formed.

The pixel electrode 160 and the common electrode 180 may respectively include a transparent, transflective, or reflective conductive material. Depending on types of materials included in the pixel electrode 160 and the common electrode 180, the OLED display may be classified as a top emission type, a bottom emission type, or a dual emission type.

An overcoat 190 covering to protect the common electrode 180 may be formed as an organic layer on the common electrode 180. A thin film encapsulation layer 140 is formed on the overcoat 190. The thin film encapsulation layer 140 seals and protects the organic light emitting element LD and the pixel driving unit formed on the substrate 123 from the outside.

The thin film encapsulation layer 140 includes organic encapsulation layers 140a and 140c and inorganic encapsulation layers 140b and 140d, which are alternately disposed with respect to each other. For example, two organic encapsulation layers 140a and 140c and two inorganic encapsulation layers 140b and 140d are alternately disposed with respect to each other, to form the thin film encapsulation layer 140 as illustrated in FIG. 4. Alternatively, the first and second sensing electrodes 142 and 143 may be formed on thin film encapsulation layer 140.

Referring to FIGS. 1 and 5, a pad portion PA is formed in the touch sensing area TA. The pad portion PA is connected to the pixel driving unit (not shown) to receive a driving signal for driving the pixels PX of the display panel 110 from the outside.

The pad portion PA including first and second pad electrodes 421 and 423 may be disposed on a first insulating layer 127. The pad portion PA may be a gate pad portion connected to the gate line or a data pad portion connected to the data line. That is, the structure illustrated in FIG. 5 may be the gate pad portion or the data pad portion. Hereinafter, a structure of the gate pad portion will be described.

The gate pad portion D_PDA is connected to the pixel driving unit via an anisotropic conductive film (not shown), to supply a scan signal to the gate line (not shown). To this end, the gate pad portion D_PDA includes a first pad electrode 421 and a second pad electrode 423. The first pad electrode 421 is coupled to the gate line to be connected to the gate line. The second pad electrode 423 includes the same metal as the data line (not shown). The second pad electrode 423 is formed as a pattern that is not connected to the data line. The second pad electrode 423 is spaced apart from the data line.

The data pad portion (not shown) is connected to the pixel driving unit via the anisotropic conductive film to transmit a data signal to the data line. The data pad portion includes a first pad electrode 421 and a second pad electrode 423. In this case, the first pad electrode 421 includes the same metal as the gate line. However, the first pad electrode 421 is formed as a pattern not connected to the gate line. The first pad electrode 421 is spaced apart from the gate line. The second pad electrode 423 is coupled to the data line to be connected to the data line. That is, the first pad electrode 421 and the second pad electrode 423 illustrated in FIG. 5 may be respectively disposed on the same layer as the gate electrode 133 and the source and drain electrodes 131 and 132 illustrated with reference to FIG. 4.

A second insulating layer 128 covering first pad electrode 421 is formed on the first insulating layer 127. A second contact hole exposing the first pad electrode 421 is formed in the second insulating layer 128. The second insulating layer 128 of FIG. 5 may be formed on the same layer as the interlayer insulating layer 128 of FIG. 4. For example, the second insulating layer 128 may include a ceramic-based material, such as silicon nitride ($SiN_x$) or silicon oxide ($SiO_x$). The second pad electrode 423 is formed on the first pad electrode 421. The second pad electrode 423 is connected to the first pad electrode 421 via the second contact hole that is formed in the second insulating layer 128.

A third insulating layer 124 covering the second pad electrode 423 is formed on the second insulating layer 128. A fourth insulating layer 125 is formed on the third insulating layer 124. In this case, the third and fourth insulating layers 124 and 125 may be respectively formed as the same layers of the planarization layer 124 and the pixel defining layer 125 of FIG. 4. In addition, a thin film encapsulation layer 140 may be formed on the fourth insulating layer 125. However, the fourth insulating layer 125 and the thin film encapsulation layer 140 may be omitted in the pad portion PA.

A third contact hole 154a, through which the second pad electrode 423 is exposed, may be formed in the third and fourth insulating layers 124 and 125 and in the thin film encapsulation layer 140. An anisotropic conductive film (not shown) may be formed on the thin film encapsulation layer 140. The anisotropic conductive film may include conductive balls. The pixel driving unit described above is electrically coupled to the gate pad portion D_PAD or the data pad portion via the anisotropic conductive film.

According to an exemplary embodiment of the present invention, in the non-touch sensing area DA, the touch wires 147 and 148 disposed on the thin film encapsulation layer 140 may be electrically coupled to the pad electrodes 421 and 423. For example, as shown in FIG. 5, the second touch wires 148 may be connected to the second pad electrode 423.

Referring back to FIG. 1, the touch wires 147 and 148 may be connected to a portion of the pad electrodes formed in the pad portion PA. The first and second touch wires 147 and 148 may transmit and receive a touch signal to and from the touch driving unit via the portion of the pad electrodes connected to the touch wires 147 and 148. In addition, the remaining pad electrodes may receive the driving signal for driving the pixels PX from the outside while being connected to the pixels PX of the display panel. In this case, the pad electrodes 421 and 423 connected to the touch wires 147 and 148 are electrically separated from the gate line or the data line described above. That is, in the present exemplary embodiment, the display panel 110 and the touch sensor 150 may be respectively connected to the pixel driving unit and the touch driving unit, via one pad portion PA formed in the non-touch sensing area DA. In this manner, the pad portion for the touch sensor 150 may be removed.

In a conventional display panel, a separate touch pad portion, which transmits and receives a touch signal in a non-touch sensing area of a touch sensor may be formed at end portions of the first and second touch wires. More particularly, separate pad portions may be respectively formed and connected to the touch sensor and the display panel. When the touch pad portions are separately formed, the touch wires and the like may be exposed to the outside, which may be damaged by moisture and the like.

According to an exemplary embodiment of the present invention, a separate touch pad portion for connecting the touch sensor 150 to the touch driving unit may be omitted. In this manner, the touch wires may be prevented from being damaged, thereby improving reliability of a product.

In a conventional display panel, a touch driving unit and a pixel driving unit may be respectively mounted as IC chips on separate printed circuit boards (PCBs), and the separate PCBs may be respectively connected to the pad portions. For example, the touch driving unit is mounted on the PCB for the touch sensor, and the pixel driving unit is mounted on the PCB for the display panel. In addition, the PCB for the touch sensor and the PCB for the display panel are respectively combined with the pad portions for the touch sensor and the pad portion for the display panel.

According to an exemplary embodiment of the present invention, the touch driving unit and the pixel driving unit may be mounted on at least one IC chip on one PCB. For example, the touch driving unit and the pixel driving unit are simultaneously mounted on the PCB 185, as illustrated in FIG. 1, and the PCB 185 may be connected to the pad portion PA. In this manner, one PCB 185 may be utilized, thereby reducing the number of PCBs used. In addition, the touch driving unit and the pixel driving unit are integrated into one IC chip, thereby reducing the number of IC chips.

Referring back to FIG. 5, the second touch wires 148 according to the present exemplary embodiment may include lower and upper touch wires 148a and 148b. That is, the second touch wires 148 may be formed as a double metal layer including upper and lower touch wires 148b and 148a.

The lower touch wires 148a are formed on the thin film encapsulation layer 140, and the first passivation layer 155 covers the lower touch wires 148a. In this case, a first contact hole 155a is formed in the first passivation layer 155, such that the upper touch wires 148b formed on the first passivation layer 155 may be connected to the lower touch wires 148a.

The upper touch wires 148b may be connected to the second pad electrode 423. In this case, a fourth contact hole 154b exposing the second pad electrode 423 may be formed in the third and fourth insulating layers 124 and 125. More particularly, the upper touch wires 148b may be connected to the second pad electrode 423, which is exposed by the fourth contact hole 154b.

In addition, the second passivation layer 156 may be formed on the upper touch wires 148b. The second passivation layer 156 covers the upper touch wires 148b, such that the upper touch wires 148b are not exposed to the outside.

Figure 6:
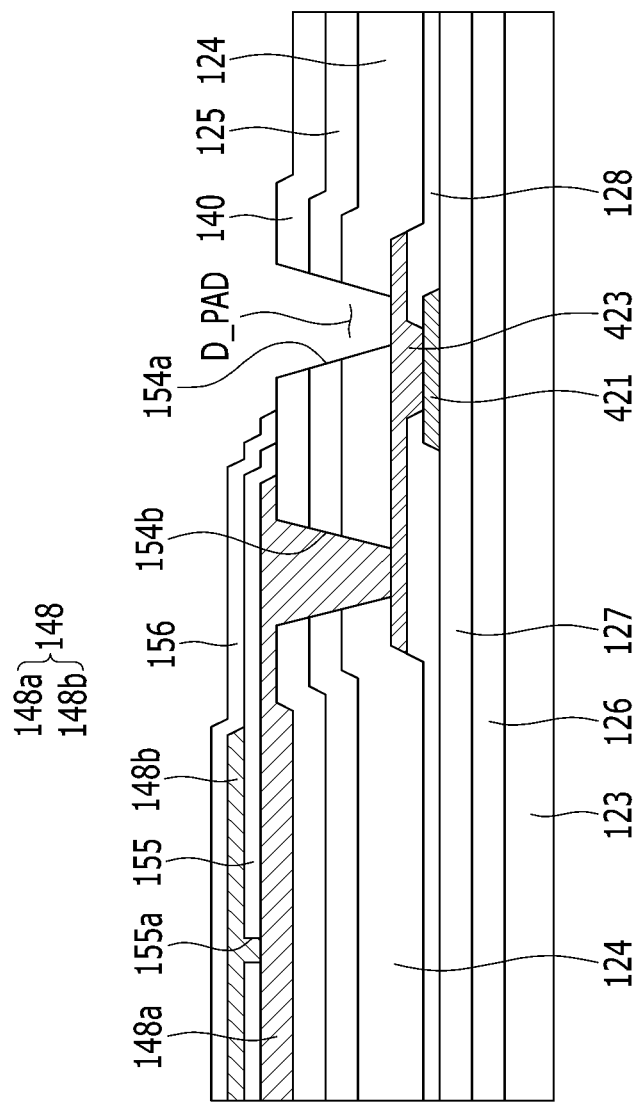
FIG. 6 is a cross-sectional view of a pad portion of the display device taken along line V-V' of FIG. 1 according to an exemplary embodiment of the present invention.

Referring to FIG. 6, according to an exemplary embodiment of the present invention, the lower touch wires 148a may be connected to the second pad electrode 423. According to the present exemplary embodiment, the lower touch wires 148a may be formed on the thin film encapsulation layer 140, to be connected to the second pad electrode 423 exposed by the fourth contact hole 154b. That is, in FIG. 5, the upper touch wires 148b are connected to the second pad electrode 423, and in FIG. 6, the lower touch wires 148a are connected to the second pad electrode 423.

Figure 7:
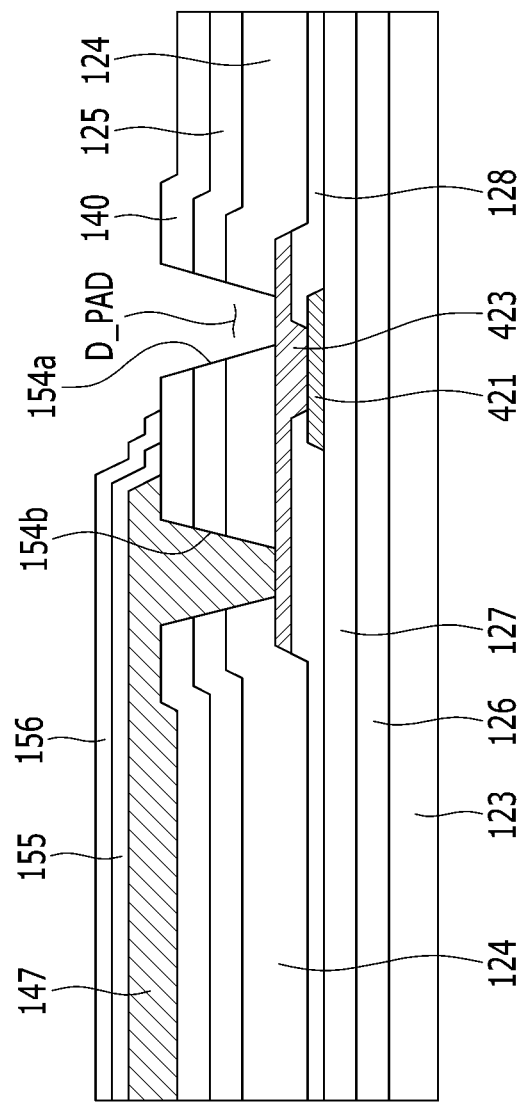
FIG. 7 is a cross-sectional view of a pad portion of the display device taken along line V-V' of FIG. 1 according to an exemplary embodiment of the present invention.

Referring to FIG. 7, according to an exemplary embodiment of the present invention, the first touch wires 147 are formed as a single metal layer, such that the first touch wires 147 are connected to the second pad electrode 423. In particular, the second touch wires 148 illustrated with reference to FIGS. 5 and 6 include the upper and lower touch wires 148a and 148b. According to the present exemplary embodiment, the first touch wires 147 are formed as a single metal layer. In this case, the first and second passivation layers 155 and 156 are sequentially disposed on the first touch wires 147. The first and second passivation layers 155 and 156 cover the first touch wires 147, such that the first touch wires 147 are not exposed.

According to exemplary embodiments of the present invention, the touch wires 147 and 148 are electrically coupled to the pad portion of the display panel. Accordingly, since a touch pad portion for the touch sensor may be omitted, the touch wires and the like may be prevented from being exposed and damaged by the moisture and the like. In addition, since the touch driving unit and the pixel driving unit are mounted on at least one IC chip on one printed circuit board (PCB), the number of chips of the PCBs and the number of ICs used may be reduced.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device, comprising:
    a display panel comprising a display unit configured to display an image;
    a pad portion disposed in a periphery of the display unit, the pad portion configured to receive a driving signal for driving the display unit; and
    a touch sensor disposed on the display panel, the touch sensor comprising:
        sensing electrodes disposed on the display panel; and
        touch wires electrically connected to the pad portion and disposed on the display panel, the touch wires being respectively connected to the sensing electrodes to transmit a touch signal,
    wherein:
    the pad portion comprises pad electrodes, each pad electrode comprising:
        a first pad electrode disposed on a display substrate;
        a first insulating layer disposed on the display substrate, the first insulating layer comprising a contact hole exposing the first pad electrode; and
        a second pad electrode disposed on the first insulating layer, the second pad electrode being connected to the first pad electrode via the second contact hole; and
    a touch wire of the touch wires is connected to the second pad electrode.

2. The display device of claim 1, wherein the sensing electrodes comprise:
    a first sensing electrode comprising first sensing cells disposed along a first direction; and
    a second sensing electrode comprising second sensing cells disposed along a second direction crossing the first direction.

3. The display device of claim 2, wherein the touch wires comprise:
    a first touch wire connected to the first sensing electrode; and
    a second touch wire connected to the second sensing electrode.

4. The display device of claim 3, wherein:
    each of the first and second touch wires comprises:
        a lower touch wire disposed on the display panel; and
        an upper touch wire disposed on the lower touch wire and spaced apart from the lower touch wire; and
    at least one of the upper and lower touch wires is connected to a first portion of the pad electrodes.

5. The display device of claim 4, further comprising:
    a first passivation layer disposed between the upper and lower touch wires, the first passivation layer comprising a first contact hole connecting the upper and lower touch wires; and
    a second passivation layer disposed on the first passivation layer and covering the upper touch wire.

6. The display device of claim 5, wherein each of the first and second passivation layers comprises at least one of silicon nitride ($SiN_x$), silicon oxide ($SiO_x$), and silicon oxynitride ($SiO_xN_y$).

7. The display device of claim 5, wherein each of the first and second passivation layers comprise at least one of a polyacrylate resin and a polyimide resin.

8. The display device of claim 2, wherein the first and second sensing electrodes are disposed on different layers from each other.

9. The display device of claim 2, wherein the first and second sensing electrodes are disposed on the same layer.

10. The display device of claim 1, wherein the first pad electrode is connected to a gate line disposed in the display unit.

11. The display device of claim 1, wherein the second pad electrode is connected to a data line disposed in the display unit.

12. The display device of claim 1, wherein the display unit comprises:
    a thin-film transistor disposed on the display substrate;
    a first electrode disposed on the thin-film transistor and electrically connected to the thin-film transistor;
    a pixel defining layer disposed on the first electrode and defining a pixel area;
    an organic emission layer disposed on the first electrode and contacting the first electrode in the pixel area; and
    a second electrode disposed on the organic emission layer.

13. The display device of claim 1, wherein a portion of the pad electrodes not connected to the touch wires are connected to the display unit.

14. A display device, comprising:

a pixel driving unit configured to transmit a data signal to a pixel via a first line, the first line connected to a first electrode of a pad portion; and a touch driving unit configured to transmit a touch signal to a touch sensor via a second line, the second line connected to a second electrode of the pad portion, wherein:

the pixel driving unit and the touch driving unit are disposed on a single printed circuit board (PCB), the single PCB being connected to the pad portion;

the first electrode comprises an upper electrode and a lower electrode;

the upper electrode is electrically connected to a gate line connected to the pixel; and the lower electrode comprises the same material as a data line connected to the pixel, the lower electrode being spaced apart from the data line.

15. A display device, comprising:

a pixel driving unit configured to transmit a data signal to a pixel via a first line, the first line connected to a first electrode of a pad portion; and a touch driving unit configured to transmit a touch signal to a touch sensor via a second line, the second line connected to a second electrode of the pad portion, wherein:

the pixel driving unit and the touch driving unit are disposed on a single printed circuit board (PCB), the single PCB being connected to the pad portion;

the first electrode comprises an upper electrode and a lower electrode;

the upper electrode is electrically connected to a data line connected to the pixel; and the lower electrode comprises the same material as a gate line connected to the pixel, the lower electrode being spaced apart from the gate line.

* * * * *